United States Patent
Maj et al.

(10) Patent No.: US 11,913,568 B2
(45) Date of Patent: Feb. 27, 2024

(54) METHOD FOR DETERMINING A SWITCHING STATE OF A VALVE, AND SOLENOID VALVE ASSEMBLY

(71) Applicant: Continental Teves AG & Co. oHG, Frankfurt am Main (DE)

(72) Inventors: Bartosz Maj, Frankfurt am Main (DE); Holger Kollmann, Frankfurt am Main (DE); Tomislav Milic, Frankfurt am Main (DE); Alexander Schönbohm, Frankfurt am Main (DE); Ralf Schröder, Frankfurt am Main (DE); Marc Lenz, Frankfurt am Main (DE); Marcus Bletz, Frankfurt am Main (DE); Jurij Schmidt, Frankfurt am Main (DE); Dieter Dinkel, Frankfurt am Main (DE)

(73) Assignee: Continental Teves AG & Co. oHG (DE)

( * ) Notice: Subject to any disclaimer, the term of this patent is extended or adjusted under 35 U.S.C. 154(b) by 449 days.

(21) Appl. No.: 17/284,869

(22) PCT Filed: Oct. 9, 2019

(86) PCT No.: PCT/EP2019/077393
§ 371 (c)(1),
(2) Date: Apr. 13, 2021

(87) PCT Pub. No.: WO2020/078805
PCT Pub. Date: Apr. 23, 2020

(65) Prior Publication Data
US 2021/0388921 A1    Dec. 16, 2021

(30) Foreign Application Priority Data
Oct. 15, 2018   (DE) ................ 10 2018 217 663.9

(51) Int. Cl.
*F16K 37/00*      (2006.01)
*B60T 8/36*       (2006.01)
(Continued)

(52) U.S. Cl.
CPC ........ *F16K 37/0083* (2013.01); *B60T 8/3655* (2013.01); *B60T 8/4045* (2013.01);
(Continued)

(58) Field of Classification Search
CPC . F16K 37/0083; G01R 31/72; G01R 31/2829; B60T 8/3655; B60T 8/4045;
(Continued)

(56) References Cited

U.S. PATENT DOCUMENTS

| 6,504,699 B1 | 1/2003 | Rader et al. |
| 6,726,189 B2 * | 4/2004 | Folchert ............ B60G 17/0523 280/124.16 |

(Continued)

FOREIGN PATENT DOCUMENTS

| DE | 19836769 C1 | 4/2000 |
| DE | 19910497 A1 | 9/2000 |

(Continued)

OTHER PUBLICATIONS

Korean Notice of Preliminary Rejection for Korean Application No. 10-2021-7006894, dated Apr. 27, 2023 with translation, 11 pages.
(Continued)

*Primary Examiner* — Rafael O Leon De Domenech
(74) *Attorney, Agent, or Firm* — Buchanan Ingersoll & Rooney PC

(57) ABSTRACT

A method for determining a switching state of a valve that is actuated by a coil, wherein the method includes: respectively ascertaining a current flowing through the coil and a voltage applied to the coil at several times which follow one another with a prespecified time interval, calculating an (Continued)

inductance variable of the coil based on the currents, the voltage and the time interval, and determining the switching state based on the inductance variable. Also disclosed is a solenoid valve assembly.

11 Claims, 1 Drawing Sheet

(51) Int. Cl.
  *B60T 8/40* (2006.01)
  *G01R 31/72* (2020.01)
  *H01F 7/18* (2006.01)
  *G01R 31/28* (2006.01)

(52) U.S. Cl.
  CPC ........... *G01R 31/72* (2020.01); *H01F 7/1844* (2013.01); *G01R 31/2829* (2013.01); *H01F 2007/185* (2013.01); *H01F 2007/1861* (2013.01); *H01F 2007/1888* (2013.01)

(58) Field of Classification Search
  CPC ............. H01F 7/1844; H01F 2007/185; H01F 2007/1861; H01F 2007/1888
  See application file for complete search history.

(56) References Cited

U.S. PATENT DOCUMENTS

| | | | | |
|---|---|---|---|---|
| 8,823,390 | B2 | 9/2014 | Keller et al. | |
| 9,618,137 | B2* | 4/2017 | Ferrer Herrera | F16K 37/0041 |
| 9,693,510 | B2* | 7/2017 | Ferrer Herrera | H02M 3/3376 |
| 10,302,220 | B2* | 5/2019 | Ferrer Herrera | F16K 37/0041 |
| 2009/0132133 | A1* | 5/2009 | Kojima | F16H 61/12 701/55 |
| 2011/0011075 | A1* | 1/2011 | Sakamoto | F16H 61/143 60/329 |
| 2015/0321653 | A1* | 11/2015 | Neu | B60T 8/36 303/10 |
| 2018/0231143 | A1 | 8/2018 | Ferrer Herrera et al. | |

FOREIGN PATENT DOCUMENTS

| | | |
|---|---|---|
| DE | 10034830 A1 | 2/2002 |
| DE | 102014216610 A1 | 2/2016 |
| EP | 1384976 A1 | 1/2004 |
| EP | 2998977 B1 | 3/2016 |
| KR | 20010039921 A | 5/2001 |
| KR | 20140034221 A | 3/2014 |

OTHER PUBLICATIONS

International Search Report and Written Opinion for International Application No. PCT/EP2019/077393, dated Dec. 18, 2019, with partial English translation, 7 pages.
International Search Report and Written Opinion for International Application No. PCT/EP2019/077393, dated Dec. 18, 2019, 12 pages (German).
German Search Report for German Application No. 10 2018 217 663.9, dated Nov. 8, 2019, with partial English translation, 12 pages.

* cited by examiner

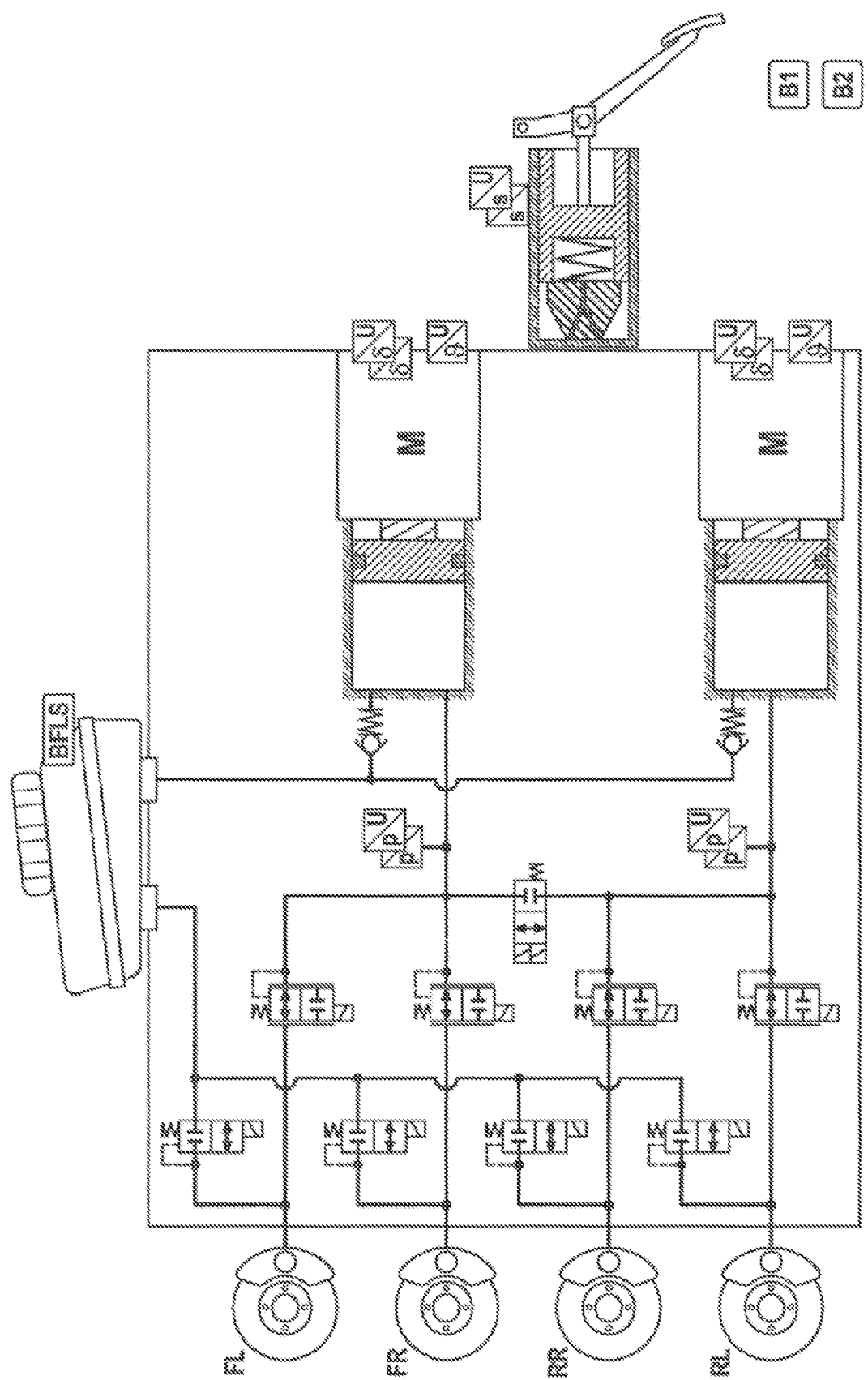

METHOD FOR DETERMINING A SWITCHING STATE OF A VALVE, AND SOLENOID VALVE ASSEMBLY

CROSS REFERENCE TO RELATED APPLICATIONS

This application is the U.S. National Phase Application of PCT International Application No. PCT/EP2019/077393, filed Oct. 9, 2019, which claims priority to German Patent Application No. 10 2018 217 663.9, filed Oct. 15, 2018, the contents of such applications being incorporated by reference herein.

FIELD OF THE INVENTION

The invention relates to a method for determining a switching state of a valve, and to a solenoid valve assembly.

BACKGROUND OF THE INVENTION

Valves can be actuated, in particular, by means of electromagnets. To this end, corresponding solenoid valve assemblies, which typically have a valve and a coil for actuating the valve, can be established.

According to the prior art, it is known to switch valves by way of applying to the respective coil a current that is suitable for switching. A magnetic field that is generated in this way typically switches the valve or keeps the valve in a specific state. However, in embodiments according to the prior art, it is typically assumed that a set or desired switching state is also actually assumed. A check is not provided.

Known normally open inlet valves shut off the hydraulic connection to a brake caliper as necessary if the system pressure is higher than the pressure that should prevail in the brake caliper. For example, this may be the case during ABS control.

In modern inlet valves, a non-return valve is typically responsible for reliably reducing the pressure in the brake caliper when the brake is released, for example in the event of a valve being stuck.

However, it is then necessary to provide further valves that are responsible for shutting the pressure in the wheel (e.g. during re-induction of an LAC). Furthermore, the so-called "crossflow" occurs.

SUMMARY OF THE INVENTION

Therefore, an aspect of the invention is a method for determining a switching state of a valve. A further aspect of the invention is an associated solenoid valve assembly.

An aspect of the invention relates to a method for determining a switching state of a valve that is actuated by means of a coil. The method comprises the following steps:
- respectively ascertaining a current flowing through the coil and a voltage applied to the coil at several times which follow one another with a prespecified time interval,
- calculating an inductance variable of the coil based on the currents, the voltage and the time interval, and
- determining the switching state based on the inductance variable.

The An aspect of the is based on the knowledge that an inductance variable can be ascertained by measuring the currents and voltages at the times mentioned, wherein a switching state of the valve can be ascertained based on this inductance variable. This allows monitoring of the switching state, that is to say for example whether the valve is open or closed. Switching of the valve can be inferred or switching of the valve can be identified from a change in the switching state.

Current and/or voltage can be ascertained, for example, by measurement. To this end, suitable measuring devices can be used. However, they can each also be ascertained by values being prespecified. This may be the case, in particular, when a value is prespecified and set by a device that is suitable for this purpose. For example, a regulated current source can therefore be used in order to set a defined current. The same applies for the voltage. In this case, it is no longer absolutely necessary to measure an actually set value, where it should be mentioned that a value of this kind can nevertheless be measured.

An inductance in the physical sense can be used as the inductance variable. However, it is also possible to use a variable which is indicative of the inductance, for example is proportional to the actual inductance, but is easier to calculate or easier to handle. There is typically a relationship, for example a linear relationship, between the inductance variable and the actual inductance.

It should be noted that the inductance variable may be easier to determine than the inductance in the strictly physical sense, wherein the inductance variable or another variable that is simpler to calculate than the inductance and is based on the inductance can also be used for determining the switching state.

A saving in respect of further valves for shutting the pressure in the wheel is also achieved owing to the non-return valve that is no longer required. In addition, there is no longer any "crossflow" effect and there is a reduction in costs owing to the non-return valve being dispensed with.

In a preferred development of the method, switching of the valve is identified from a change in the switching state.

In a preferred development of the method, a switching state of the valve is monitored by identifying a voltage peak. This is based on the knowledge that a voltage peak can occur when the switching state changes. This can be identified, in particular, by means of suitable sensor systems and used accordingly. For example, tappet opening control can be implemented in this respect.

It should be understood that identifying a switching state by identifying a voltage peak can represent an independent aspect of the invention that can also be used independently of other features and embodiments disclosed in this document, but can also be combined with these as desired.

As an alternative or in addition, the switching state of a valve is identified from a test signal. This can be impressed on the coil, so that the switching state can be identified.

In a preferred development of the method, the coil is driven by means of pulse-width modulation. In this case, the current and the voltage are preferably each averaged over a pulse-width modulation period. It has been shown that, in this case, it is possible to employ the method in an advantageous manner in a coil that is driven by means of pulse-width modulation too.

In a preferred development of the invention, the method is executed continuously or continually repeatedly. This means that the state of a valve can be continuously monitored.

In a preferred development of the invention, the following steps are carried out:
- comparing the inductance variable with a first end value and a second end value, determining a first switching state if the inductance variable is at most at a predetermined distance from the first end value, and determining a second switching state if the inductance variable is at most at a predetermined distance from the second end value.

In a preferred development of the method, the switching states are end states of the valve. However, it is also possible to ascertain intermediate states.

An aspect of the invention further relates to a solenoid valve assembly having a valve, a coil for actuating the valve, a control device for applying a current and/or a voltage to the coil, and a state determination device which is configured to execute a method as claimed in one of the preceding claims.

An aspect of the invention further relates to a solenoid valve assembly. Said solenoid valve assembly has a valve and a coil for actuating the valve. It further has a control device for applying a current and/or a voltage to the coil. As a result, the valve or the coil can be actuated.

The solenoid valve assembly further has a state determination device which is configured to execute a method according to an aspect of the invention. All of the embodiments and variants described herein can be used here.

By means of the solenoid valve assembly according to an aspect of the invention, the advantages mentioned further above can be utilized for a solenoid valve assembly.

An aspect of the invention further relates to a non-volatile, computer-readable storage medium on which program code is stored, during the execution of which a method according to an aspect of the invention is executed. With respect to the method according to an aspect of the invention, all of the embodiments and variants described herein can be used.

BRIEF DESCRIPTION OF THE DRAWINGS

Further features and advantages will be gathered by a person skilled in the art from the exemplary embodiment described below with reference to the appended drawing, in which:

The FIGURE shows a hydraulic circuit diagram of a brake system that functions merely with use of an inlet valve without a non-return valve.

DETAILED DESCRIPTION OF THE PREFERRED EMBODIMENTS

Owing to an aspect of the invention, it is possible to provide a normally open inlet valve without a non-return valve, but with tappet opening control.

In order to implement a normally open inlet valve without a non-return valve, monitoring is advantageously performed as to whether the tappet of the inlet valve falls back to its starting position (open), after the coil is switched off. This can occur, for example, as described further above in accordance with one or more of the embodiments shown. However, this can also occur as described below for example.

A voltage is induced in the coil due to an opening movement of the tappet. The opening point (upper stop of the tappet) can typically be clearly identified by a voltage peak in this case.

In the event that no opening has been detected, for example because the tappet is stuck, the outlet valve can be switched in order to reliably reduce the pressure in the brake caliper.

The advantages of an inlet valve without a non-return valve are, in particular, the saving in respect of further valves that are responsible for shutting the pressure in the wheel (e.g. during re-induction of an LAC), the prevention of a so-called "crossflow" and a reduction in costs owing to the non-return valve being dispensed with.

An exemplary hydraulic circuit diagram for a brake system that functions merely with use of an inlet valve without a non-return valve is illustrated in the FIGURE. This will not be described further here, but rather reference may be made to the clearly comprehensible hydraulic circuit diagram.

The invention claimed is:

1. A method for determining a switching state of an inlet valve that is actuated by a coil, wherein the method comprises:

respectively ascertaining a current flowing through the coil and a voltage applied to the coil at several times which follow one another with a prespecified time interval, calculating an inductance variable of the coil based on the currents, the voltage and the time interval, determining the switching state based on the inductance variable, and monitoring the switching state of the inlet valve by monitoring whether a tappet of the inlet valve falls back to a tappet starting position after the coil is switched off, and without a non-return valve.

2. The method as claimed in claim 1, wherein switching of the inlet valve is identified from a change in the switching state.

3. The method as claimed in claim 1, wherein the switching state of the inlet valve is identified from a test signal.

4. The method as claimed in claim 1, wherein the coil is driven by pulse-width modulation, and wherein the current and the voltage are each averaged over a pulse-width modulation period.

5. The method as claimed in claim 1, which is executed continuously or continually repeatedly.

6. The method as claimed in claim 1, wherein the inductance variable is compared with a first end value and a second end value, wherein a first switching state is determined if the inductance variable is at most at a predetermined distance from the first end value, and wherein a second switching state is determined if the inductance variable is at most at a predetermined distance from the second end value.

7. The method as claimed in claim 6, wherein the switching states are end states of the inlet valve.

8. A solenoid valve assembly, comprising:

a valve, a coil for actuating the valve, a control device for applying a current and/or a voltage to the coil, and a state determination device which is configured to execute a method as claimed in claim 1.

9. The method as claimed in claim 1, wherein the switching state of the inlet valve is further monitored by identifying a voltage peak.

10. The method as claimed in claim 1, wherein the inlet valve is a normally open inlet valve.

11. The method as claimed in claim 1, wherein the tappet starting position after the coil is switched off is open.

\* \* \* \* \*